(12) United States Patent
Kataoka et al.

(10) Patent No.: US 6,342,752 B1
(45) Date of Patent: Jan. 29, 2002

(54) PIEZOELECTRIC TRANSFORMER ELEMENT AND METHOD OF MOUNTING IT IN A HOUSING

(75) Inventors: Masako Kataoka; Takeshi Fujimura; Katsuyuki Ishikawa; Takahiro Yamakawa; Keizo Tsukamoto, all of Tokyo (JP)

(73) Assignee: Taiheiyo Cement Corporation, Tokyo (JP)

(*) Notice: Subject to any disclaimer, the term of this patent is extended or adjusted under 35 U.S.C. 154(b) by 0 days.

(21) Appl. No.: 09/529,395

(22) PCT Filed: Oct. 14, 1998

(86) PCT No.: PCT/JP98/04643

§ 371 Date: Apr. 12, 2000

§ 102(e) Date: Apr. 12, 2000

(87) PCT Pub. No.: WO99/19916

PCT Pub. Date: Apr. 22, 1999

(30) Foreign Application Priority Data

Oct. 15, 1997 (JP) .............................. 9-281851
Jul. 2, 1998 (JP) ............................. 10-187749

(51) Int. Cl.⁷ ...................... H01L 41/053; H01L 41/107
(52) U.S. Cl. ...................................... 310/357; 310/359
(58) Field of Search ............................... 310/357, 359, 310/363, 366

(56) References Cited

U.S. PATENT DOCUMENTS 5,440,195 A * 8/1995 Ohnishi et al. ............. 310/359
5,705,879 A   1/1998 Abe et al. ................... 310/359
5,736,807 A * 4/1998 Hakamata et al. .......... 310/359
5,959,391 A * 9/1999 Ogisco et al. .............. 310/359
6,172,447 B1 * 1/2001 Ishikawa et al. ............ 310/359

FOREIGN PATENT DOCUMENTS

| EP | 0665600 | 8/1995 |
| JP | 7302938 | 11/1995 |
| JP | 08213665 | 8/1996 |
| JP | 09116250 | 5/1997 |
| JP | 09223828 | 8/1997 |

OTHER PUBLICATIONS

"Vibrating Modes, Surface Electric Charge and Potential Distributions of Ceramic Transformer" *Electronic Ceramic*, Summer 1976.

* cited by examiner

Primary Examiner—Brian Sircus
Assistant Examiner—Michael C. Zarroli
(74) Attorney, Agent, or Firm—Burns, Doane, Swecker & Mathis, LLP

(57) ABSTRACT

Mount terminals (32–34) formed on the end faces of a housing (31) in the longitudinal direction respectively abut against external electrodes (1, 2) which are formed on an end face of a piezoelectric element (6) in the longitudinal direction and used to apply input voltage, and an external electrode (3) for extracting output voltage. These abutted portions are fixed by soldering or with conductive adhesive to electrically connect the mount terminals to the external electrodes and fix the piezoelectric element (6) inside the housing (31).

4 Claims, 14 Drawing Sheets

FIG. 19
λ MODE

| | BOOSTING RATIO | HEAT / K | EFFICIENCY / % |
|---|---|---|---|
| FOURTH EMBODIMENT (FIGS. 14 & 15) | 65 | 13 | 72 |
| FIFTH EMBODIMENT (FIGS. 5 16 & 17) | 65 | 13 | 72 |
| SUPPORT ELEMENT AT NODE (USING LEAD WIRE) | 70 | 8 | 76 |

FIG. 20
λ/2 MODE

| | BOOSTING RATIO | HEAT / K | EFFICIENCY / % |
|---|---|---|---|
| FOURTH EMBODIMENT (FIGS. 14 & 15) | 68 | 22 | 70 |
| FIFTH EMBODIMENT (FIGS. 5 16 & 17) | 67 | 23 | 68 |
| SUPPORT ELEMENT AT NODE (USING LEAD WIRE) | 78 | 14 | 73 |

PIEZOELECTRIC TRANSFORMER ELEMENT AND METHOD OF MOUNTING IT IN A HOUSING

TECHNICAL FIELD

The present invention relates to a piezoelectric transformer element suitably used to, e.g., turn on a cold cathode tube, and a method of housing the same.

BACKGROUND ART

A cold cathode tube is generally used for the backlight of the liquid crystal display of a notebook personal computer or the like. This cold cathode tube requires high voltage of about 1 kV to turn it on, and voltage of several hundred V to keep it on. The cold cathode tube can be kept on at voltage much lower than the voltage required to turn it on. The operation characteristics of the cold cathode device are similar to the operation characteristics of a piezoelectric transformer element, so that an inverter having such a piezoelectric transformer element is recently being used as a power supply for the cold cathode tube.

As the piezoelectric transformer element, a Rosen piezoelectric transformer element like the one shown in FIG. 21 is widely used.

FIG. 21 is a perspective view showing a general Rosen piezoelectric transformer element. In FIG. 21, a piezoelectric transformer element 106 has a rectangular shape, its left half in FIG. 21 serves as an input region, and its right half in FIG. 21 serves as an output region. External electrodes 101 and 102, as input electrodes for applying input voltage, are formed on the upper and lower surfaces of the input region. An external electrode 103, as an output electrode for extracting boosted AC voltage, is formed on the end face of the output region. When an AC voltage (input voltage) having a resonance frequency determined by the material and length of the piezoelectric transformer element 106 is applied between the external electrodes 101 and 102, the piezoelectric transformer element 106 mechanically vibrates and resonates in the longitudinal direction. The mechanical vibration generates boosted AC voltage between either one of the external electrodes 101 and 102 as a ground electrode common to the input and output sides, and the external electrode 103. The boosting ratio as the ratio of the output voltage to the input voltage is proportional to the ratio of the distance between the output electrodes and the distance between the input electrodes.

As the piezoelectric transformer element, a single-plate piezoelectric transformer element as the one shown in FIG. 21 has conventionally been used. In an inverter having such a single-plate piezoelectric transformer element, the boosting ratio is about 10 at most. To turn on a cold cathode tube for a notebook personal computer, a boosting winding transformer must be provided on the input stage of the piezoelectric transformer element. Accordingly, to obtain a higher boosting ratio than that of the single-plate piezoelectric transformer element, and to eliminate the winding transformer from the input stage, a piezoelectric transformer element having a structure in which the distance between internal electrodes in the input region of piezoelectric layers is decreased, i.e., the thin piezoelectric layers and the internal electrodes are stacked, is formed.

In this multilayer piezoelectric transformer element, the electrodes in the input region must be electrically connected. As the connection method, for example, Japanese Patent Laid-Open No. 7-302938 discloses the method in which electrodes 305 for electrically connecting internal electrodes 301a and 302a in the input region between external electrodes 301 and 302 are formed at the corners of the side or end faces of a piezoelectric transformer element 306, as shown in FIG. 24. In Japanese Patent No. 8-52553, the present applicant proposed a method of alternately connecting a plurality of internal electrode layers stacked inside the input region of a piezoelectric transformer element by two columnar conductors (to be referred to as interlevel connection conductors hereinafter).

When such a piezoelectric transformer element is mounted on a circuit board, the piezoelectric transformer element is often used in a housing so as not to expose the high-voltage portion. In a conventional multilayer piezoelectric transformer element, lead wires are bonded with solder or conductive adhesive to external electrodes formed on the upper and lower surfaces of the input region, similar to the external electrodes 101 and 102 in FIG. 21. Although the piezoelectric transformer element has the advantage of a small thickness, mounting the piezoelectric transformer element connected to the lead wires requires a margin of at least the diameter of the lead wire between the element and the board, and a space for at least the diameter of the lead wire above the piezoelectric transformer element. As a result, the thickness of the housing increases, and the advantage of the thin piezoelectric transformer element cannot be fully exploited.

The housing must be designed to have a large thickness in consideration of the diameter of the lead wire and the thickness of solder or conductive adhesive for bonding the lead wire. The thickness of the piezoelectric transformer module upon mounting, therefore increases with "thickness for the bonding space".

To solve this problem, for example, according to Japanese Patent Laid-Open No. 9-116250, input electrodes 201 and 202 are formed on upper and lower surfaces on the primary side of a piezoelectric transformer element 206 and extended to the side surfaces of the element to form lead electrodes 201a and 202a so as to fix the piezoelectric transformer element 206 to a housing 205 by terminals 210A and 210B at node positions of the side surfaces in the longitudinal direction, as shown in FIGS. 22 and 23. Output electrodes 204 are formed on the two side surfaces of the element on the secondary side. This structure can make the housing thin and simplify the mounting process.

However, with recent developments in notebook personal computers or portable information terminals, demands have arisen for smaller-size apparatus. Along with this, the difference in size between the liquid crystal display and the main body is diminishing. Since an inverter for the backlight of the liquid crystal display is generally arranged around the liquid crystal display, the inverter must be narrowed as the outer dimension of the main body of a personal computer or the like is downsized.

By the conventional housing method, however, the housing or module can be made thin, but the housing cannot be narrowed.

DISCLOSURE OF INVENTION

It is an object of the present invention to provide a piezoelectric transformer element whose height and width necessary for mounting can be decreased, and a method of housing the same.

To achieve the above object, a piezoelectric transformer element of the present invention is characterized by the following arrangement.

A piezoelectric transformer element with a multilayer structure having an input region which is polarized in a direction of thickness and has input electrodes, and an output region which is polarized in a longitudinal direction and has an output electrode is characterized by comprising a plurality of internal electrodes as the input electrode which are formed between a plurality of piezoelectric layers, first and second external electrodes formed on an end face of the piezoelectric transformer element in the longitudinal direction on the input region side, and an external electrode formed on an end face of the piezoelectric transformer element in the longitudinal direction on the output region side, wherein the plurality of internal electrodes are alternately connected to the first and second external electrodes every other layer, and the external electrodes are electrodes for applying input voltage. With this structure, when the piezoelectric transformer element is mounted on another member, the element can be connected at only its end face in the longitudinal direction, and the height and width (width of widthwise direction of the element) necessary for mounting can be reduced.

The element preferably further comprises third and fourth external electrodes formed on side surfaces parallel to the longitudinal direction of the piezoelectric transformer element on the input region side, and the plurality of internal electrodes are also alternately connected to the third and fourth external electrodes every other layer.

The element preferably further comprises a plurality of columnar conductors formed inside the input region, and the plurality of internal electrodes are alternately connected via the plurality of columnar conductors every other layer.

This arrangement can greatly reduce the possibility of failing to drive the piezoelectric transformer element.

The third and fourth external electrodes or the plurality of columnar conductors are desirably formed at positions corresponding to vibration nodes of the piezoelectric transformer element.

To achieve the above object, a piezoelectric transformer element housing method of the present invention is characterized by the following steps.

More specifically, a piezoelectric transformer element housing method of mounting the piezoelectric transformer element having the above arrangement on a housing is characterized by comprising the steps of forming a plurality of mount terminals on two end faces of the housing in a longitudinal direction, inserting the piezoelectric transformer element in the housing to make the plurality of mount terminals abut against the first and second external electrodes and the output electrode, and fixing the abutted portions by a conductive connection material. By this method, the piezoelectric transformer element can be mounted on the housing capable of connecting the element at only its end face in the longitudinal direction, the height and width (width of widthwise direction of the element) necessary for mounting can be reduced, and the manufacturing process can be simplified.

Alternatively, a piezoelectric transformer element housing method of mounting the piezoelectric transformer element having the above arrangement on a housing is characterized by comprising the steps of forming projections near positions inside the housing where two end faces of the element in a longitudinal direction are located after the piezoelectric transformer element is housed, and supporting the piezoelectric transformer element by the projections, connecting, via lead wires, the first and second external electrodes to a plurality of mount terminals formed on an end face of the housing in the longitudinal direction, and connecting, via a lead wire, the output electrode to a mount terminal formed on the other end face of the housing in the longitudinal direction. By this method, the piezoelectric transformer element can be mounted on the housing capable of connecting the element at only its end face in the longitudinal direction, and the height and width (width of widthwise direction of the element) necessary for mounting can be reduced.

Other features and advantages of the present invention will be apparent from the following description taken in conjunction with the accompanying drawings, in which like reference characters designate the same or similar parts throughout the figures thereof.

BRIEF DESCRIPTION OF DRAWINGS

FIG. 19 is a table (λ mode) showing the comparison results between the piezoelectric transformer element supporting method according to the fourth and fifth embodiments, and a conventional method of supporting the piezoelectric transformer element at nodes;

FIG. 20 is a table (λ/2 mode) showing the comparison results between the piezoelectric transformer element supporting method according to the fourth and fifth embodiments, and the conventional method of supporting the piezoelectric transformer element at nodes;

BEST MODE FOR CARRYING OUT THE INVENTION

Embodiments of a piezoelectric transformer element according to the present invention will be described in detail with reference to the accompanying drawings. In the following description, the end faces of the piezoelectric transformer element, in the longitudinal direction means two faces not including a position corresponding to a vibration node upon driving the element in the λ or λ/2 mode.

First Embodiment

Figure 1:
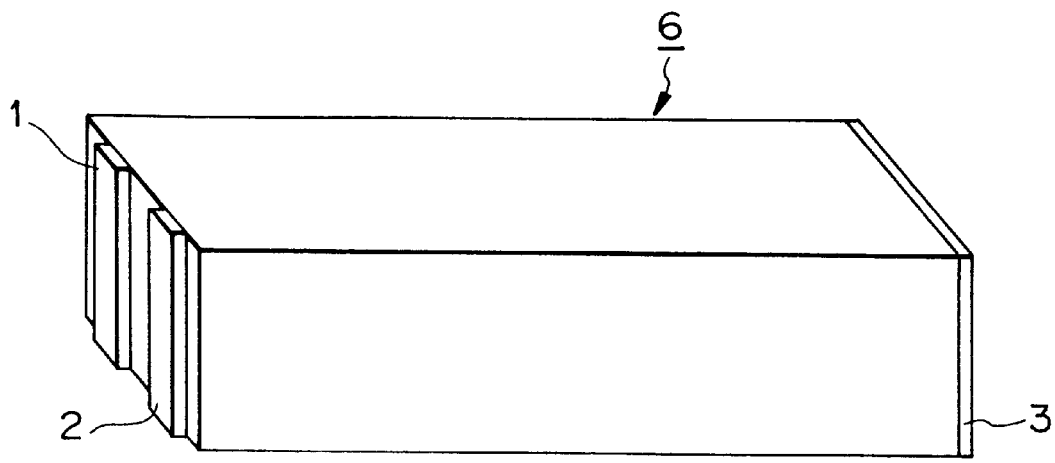
FIG. 1 is a perspective view showing a piezoelectric transformer element according to the first embodiment of the present invention.
Figure 2:
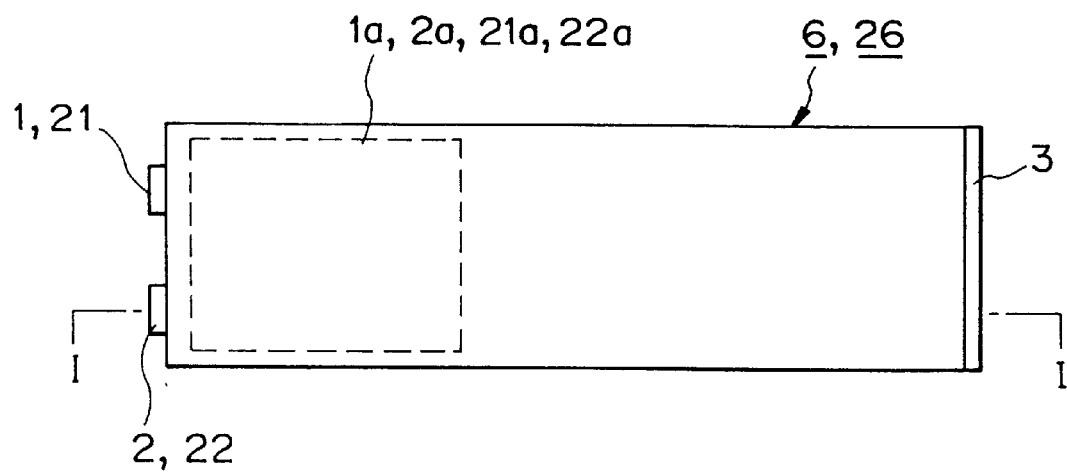
FIG. 2 is a front view of the piezoelectric transformer element in FIG. 1.
Figure 3:
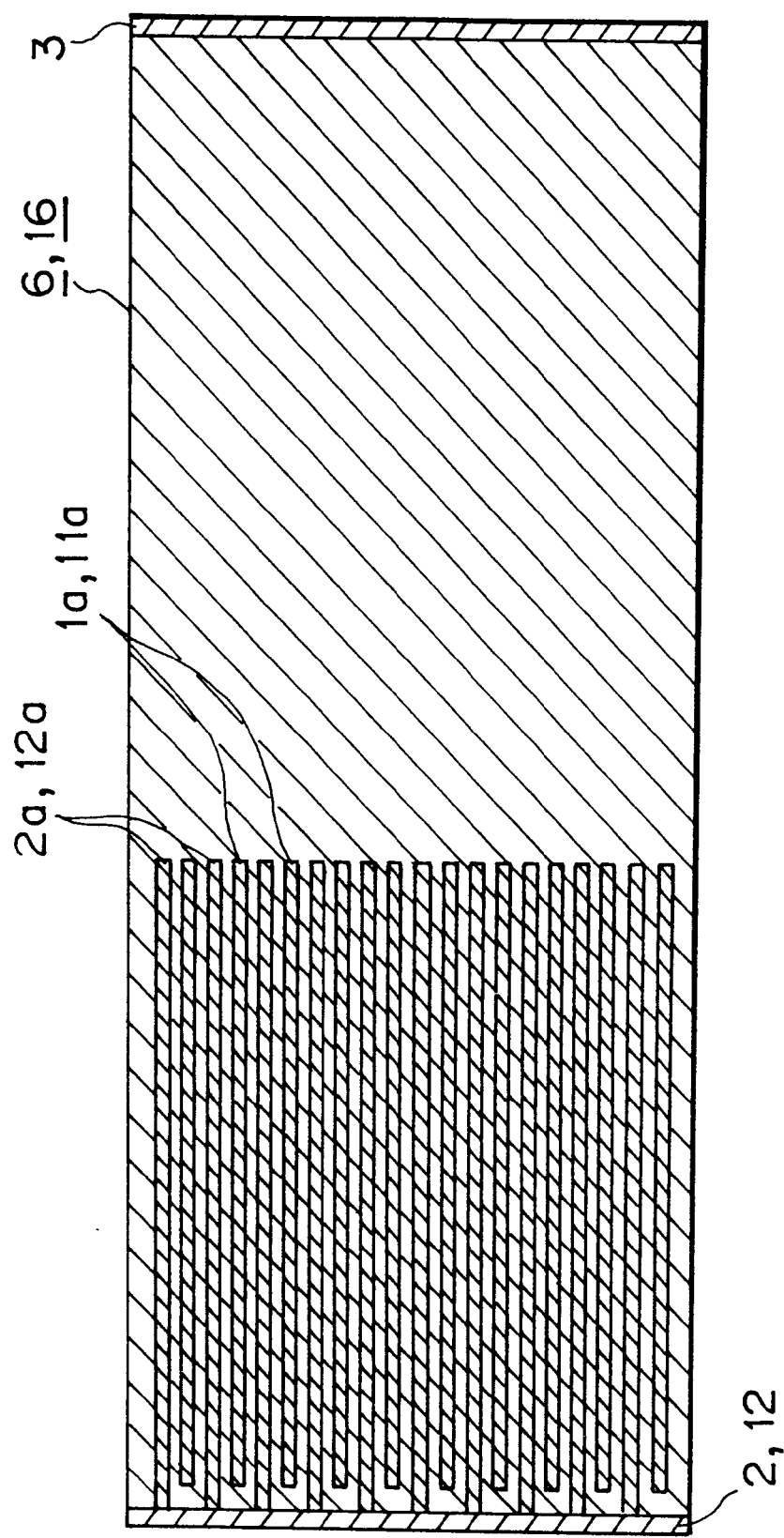
FIG. 3 is a sectional view taken along the line I—I in FIG. 2.

FIG. 1 is a perspective view showing a piezoelectric transformer element according to the first embodiment of the present invention. FIG. 2 is a front view of the piezoelectric transformer element in FIG. 1. FIG. 3 is a sectional view taken along the line I—I in FIG. 2.

As shown in FIGS. 1 to 3, external electrodes 1 and 2 for applying input voltage are formed on the end face of the input region, left side of the longitudinal direction, of a piezoelectric transformer element 6. An external electrode 3 for extracting boosted high voltage is formed on the end face of the output region, right side of the longitudinal direction. Pluralities of internal electrodes 1a and 2a are alternately stacked via thin-plate-like piezoelectric green sheets (corresponding to piezoelectric green sheets 8 before sintering; to be described later) in the input region of the piezoelectric transformer element 6. The internal electrodes 1a and 2a have projections to be respectively connected to the external electrodes 1 and 2. Note that each internal electrode need not be formed in the piezoelectric transformer element but may be exposed on the side surface.

The manufacturing process of the piezoelectric transformer element 6 having this structure will be described with reference to FIGS. 4 and 5.

Figure 4:
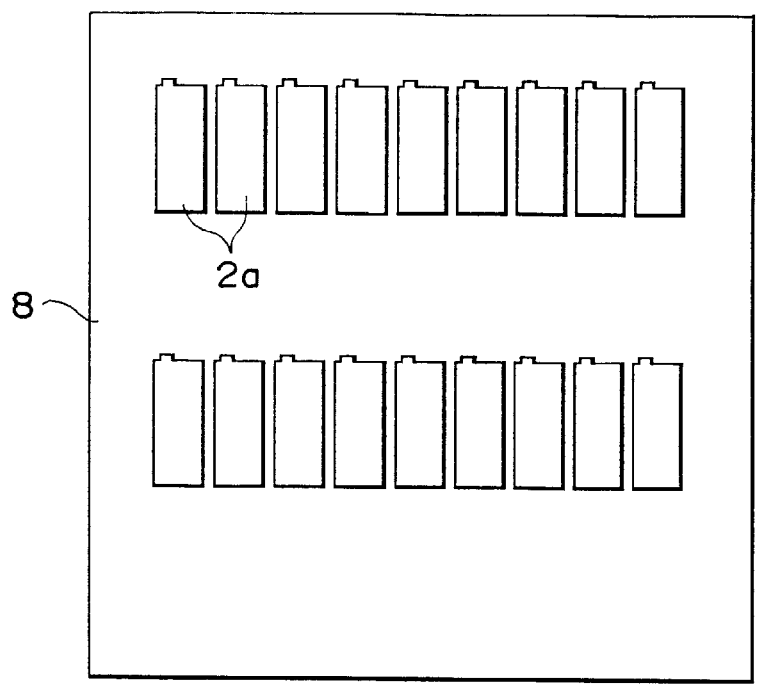
FIG. 4 is a plan view showing a plurality of internal electrodes formed on a piezoelectric green sheet according to the first embodiment of the present invention.
Figure 5:
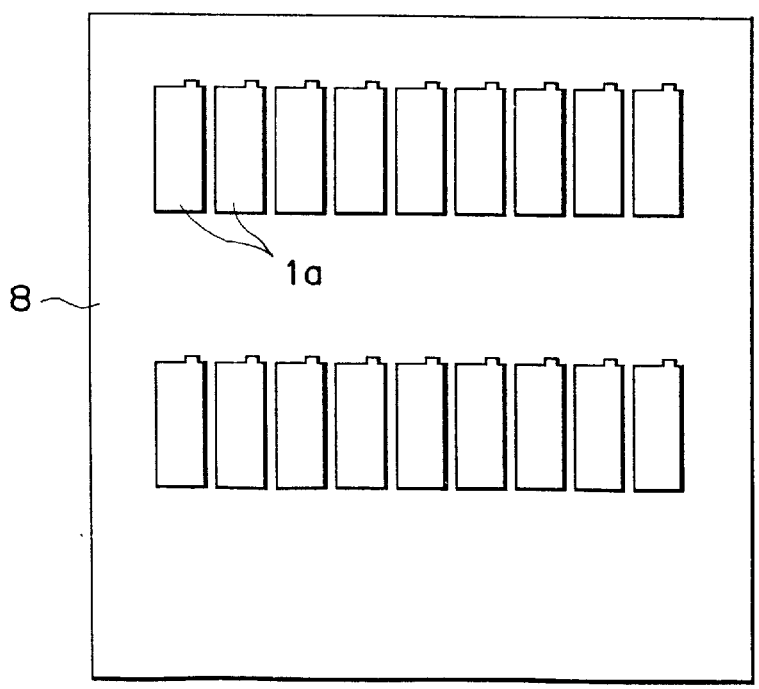
FIG. 5 is a plan view showing a plurality of internal electrodes formed on a piezoelectric green sheet according to the first embodiment of the present invention.

FIGS. 4 and 5 are views showing a plurality of internal electrodes formed on a piezoelectric green sheet according to the first embodiment of the present invention. The piezoelectric sheets are alternately stacked and cut into a predetermined shape to form a piezoelectric transformer element 6 having no external electrodes 1 to 3.

(1) 25 parts by weight of water and 10 parts of weight of an emulsion acrylic binder are mixed with 100 parts by weight of a Pb(Zr,Ti)O$_3$-based piezoelectric material powder, and the resultant material is slurried by a ball mill. This slurry is processed into a 130-μm thick piezoelectric green sheet using a doctor blade. The 130-μm thick green sheet is sintered to obtain a thickness of 100 μm after sintering.

(2) The obtained piezoelectric green sheet 8 is cut into a 100 mm×100 mm shape and bonded to a printing frame. Ag—Pd paste for forming the internal electrodes 1a and 2a is printed on the piezoelectric green sheet 8 using screen masks. The internal electrodes 1a and 2a are printed to have an outer dimension of 16 mm×4.6 mm upon calculation and to be located in the input region upon stacking. Each of the internal electrodes 1a and 2a is provided with a projection on one side of the rectangle so as to be partially exposed on the end face of the element and connected to a corresponding one of the external electrodes 1 and 2. To alternately connect the internal electrodes 1a and 2a to the external electrodes 1 and 2 every other layer, two types of screen masks are used as an odd-numbered sheet (FIG. 5) and an even-numbered sheet (FIG. 4) upon stacking.

(3) 10 piezoelectric green sheets 8 on which internal electrodes 1a are printed, and 10 piezoelectric green sheets 8 on which internal electrodes 2a are printed are alternately stacked, a piezoelectric green sheet on which no electrode is printed is put on the top, and all the sheets are thermally pressed at 100° C. and 30 MPa. The resultant structure is sintered using an alumina vessel in the air at 1,150° C. for 2 hours. By stacking and calcining the 21 piezoelectric sheets, the element has a thickness of 2.2 mm upon calculation.

(4) After the sintering, the sintered structure is cut into a plurality of 32 mm×5 mm elements by a diamond cutter. 2-mm wide Ag paste for forming the external electrodes 1 and 2 is printed on the projections of the internal electrodes 1a and 2a exposed on the end face of the input region of each cut element. Ag paste for forming the external electrode 3 is printed on the end face of the output region of the element. The element printed with the Ag paste is loaded into a furnace at 700° C. to sinter the paste, thereby forming an external electrode 1, 2, and 3.

(5) The sintered element is dipped in insulating oil at 150° C. to polarize the input region at field strength of 3 kV/mm for 30 minutes. The external electrodes of the input region are short-circuited, and DC voltage of 1.5 kV/mm is applied between the short-circuited portion and the external electrode on the end face of the output region to perform polarization for 30 minutes, thereby obtaining a piezoelectric transformer element 6.

In the piezoelectric transformer element 6 described in the first embodiment, the external electrodes 1 and 2 for applying input voltage are formed on the end face of the element in the longitudinal direction. This structure does not require any lead wire or external electrode for applying input voltage on the side surface of the element, different from a conventional piezoelectric transformer element. Therefore, the height and width (width of widthwise direction) of the element including lead wires and external electrodes can be reduced.

Projections are formed on the internal electrodes 1a and 2a, exposed on the end face of the element, and connected to the external electrodes 1 and 2. With this structure, in the manufacturing process, the step of electrically connecting internal electrodes and the step of forming external electrodes for the input region can be combined into one step.

Second Embodiment

Figure 6:
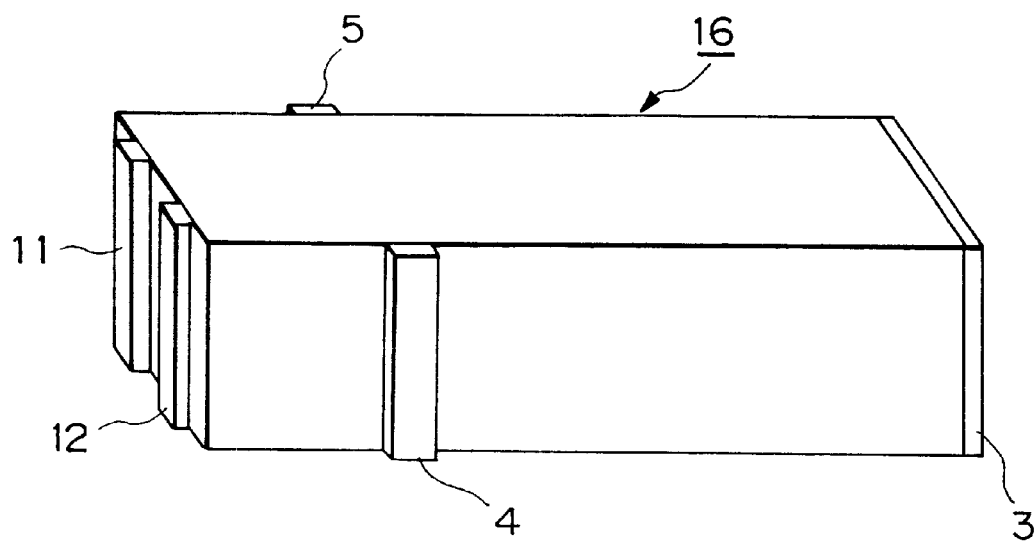
FIG. 6 is a perspective view showing a piezoelectric transformer element according to the second embodiment of the present invention.
Figure 7:
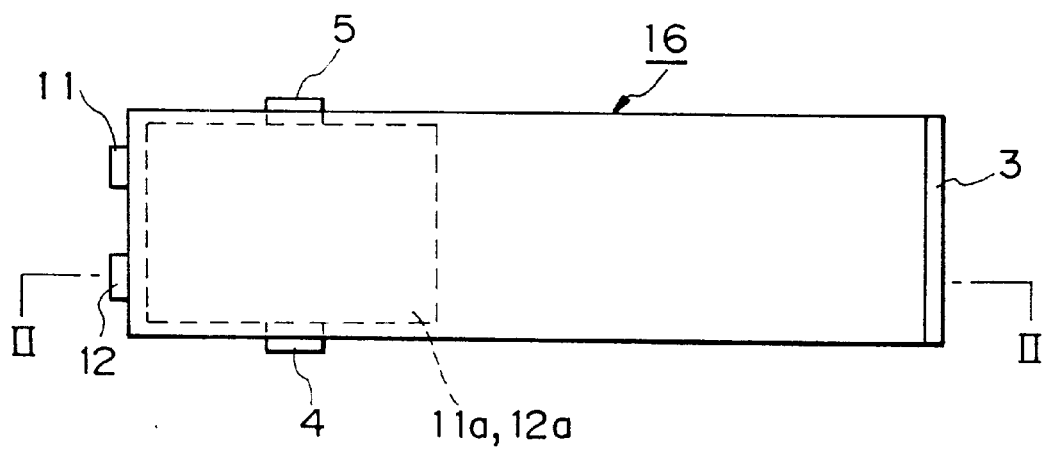
FIG. 7 is a front view of the piezoelectric transformer element in FIG. 6.

FIG. 6 is a perspective view showing a piezoelectric transformer element according to the second embodiment of the present invention. FIG. 7 is a front view of the piezoelectric transformer element in FIG. 6. The section of the piezoelectric transformer element shown in FIG. 7 that is taken along the line II—II is similar to that shown in FIG. 3.

As shown in FIGS. 6 and 7, the end faces of the input and output regions of a piezoelectric transformer element 16 in the longitudinal direction have the same structures as those in the piezoelectric transformer element 6 according to the first embodiment. Also, the multilayer structure of internal electrodes 11a and 12a is almost the same as that in the piezoelectric transformer element 6 according to the first embodiment except that the internal electrodes 11a and 12a are provided with second projections in the widthwise direction of the element in addition to first projections in the longitudinal direction. In the second embodiment, the second projections are exposed on the side surfaces of the piezoelectric transformer element 16 and connected to external electrodes 4 and 5. Note that the second projections provided to the internal electrodes 11a and 12a, and the external electrodes 4 and 5, are preferably formed at positions corresponding to the vibration nodes of the piezoelectric transformer element 16.

The manufacturing process of the piezoelectric transformer element 16 having this structure will be described with reference to FIGS. 8 and 9.

Figure 8:
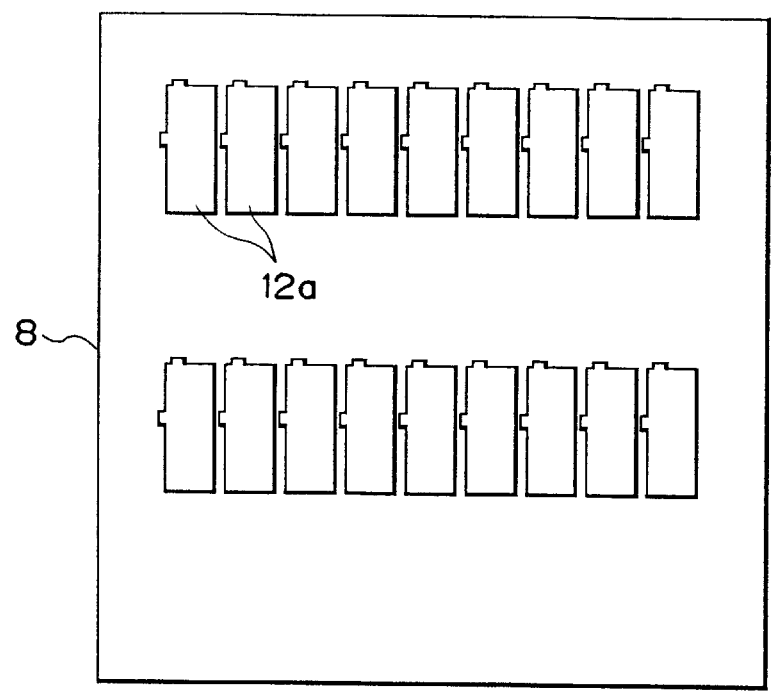
FIG. 8 is a plan view showing a plurality of internal electrodes formed on a piezoelectric green sheet according to the second embodiment of the present invention.
Figure 9:
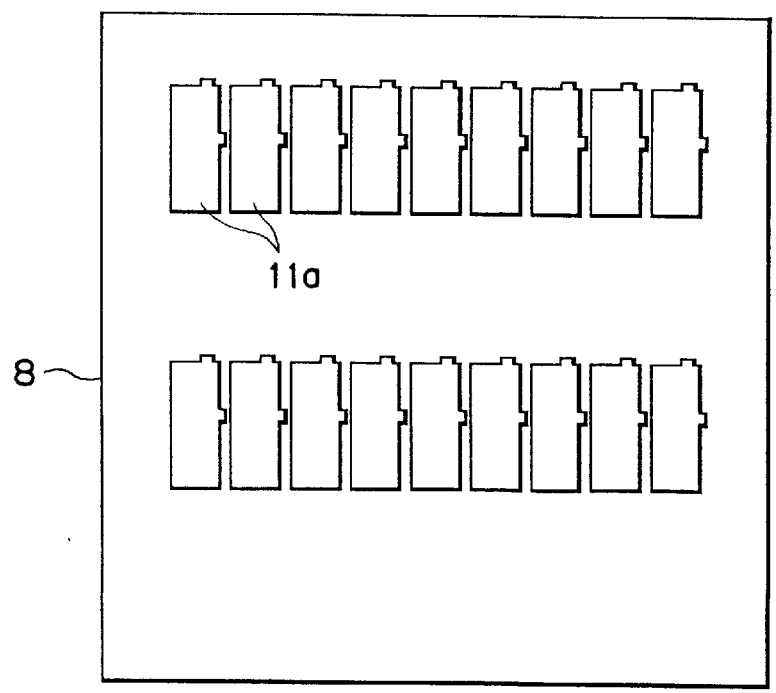
FIG. 9 is a plan view showing a plurality of internal electrodes formed on a piezoelectric green sheet according to the second embodiment of the present invention.

FIGS. 8 and 9 are views showing a plurality of internal electrodes formed on a piezoelectric green sheet according to the second embodiment of the present invention. Such piezoelectric green sheets are alternately stacked and cut into a predetermined shape to form a piezoelectric transformer element 16 having no external electrodes 3, 4, 5, 11, and 12.

(1) By the same method as in the first embodiment, a piezoelectric green sheet 8 is manufactured and bonded to a frame. In the second embodiment, as shown in FIGS. 8 and 9, each of the internal electrodes 11a and 12a has projections on two sides of the rectangle in order to electrically connect the respective layers on the end face and side surface of the element.

(2) 10 piezoelectric green sheets 8 on which internal electrodes 11a are printed, and 10 piezoelectric green sheets 8 on which internal electrodes 12a are printed are alternately stacked, a piezoelectric green sheet on which no electrode is printed is put on the top, and all the sheets are thermally pressed at 100° C. and 30 MPa. The resultant structure is sintered using an alumina vessel in the air at 1,150° C. for 2 hours.

(3) After the sintering, the sintered structure is cut into a plurality of 32 mm×5 mm elements by a diamond cutter. 2-mm wide Ag paste for forming the external electrodes 11, 12, 4, and 5 is printed on the projections of the internal electrodes 11a and 12a exposed on the end face and side surface of the input region of each cut element. Ag paste for forming the external electrode 3 is printed on the end face of the output region of the element. The element printed with the Ag paste is loaded into a furnace at 700° C. to sinter the paste, thereby forming external electrodes 11, 12, 4, and 5. At this time, a plurality of internal electrodes 11a are electrically connected to the external electrodes 11 and 5, whereas a plurality of internal electrodes 12a are electrically connected to the external electrodes 12 and 4. In the second embodiment, the sintered external electrodes 4 and 5 have a thickness around several μm to 10 μm.

(4) The sintered element is dipped in insulating oil at 150° C. to polarize the input region at field strength of 3 kV/mm for 30 minutes. The external electrodes of the input region are short-circuited, and DC voltage of 1.5 kV/mm is applied between the short-circuited portion and the external electrode on the end face of the output region to perform polarization for 30 minutes, thereby obtaining a piezoelectric transformer element 16.

In the piezoelectric transformer element 16 described in the second embodiment, since the internal electrode is connected to the two electrodes on the end face and the side surface, the possibility of failing to drive the element can be greatly reduced, and a piezoelectric transformer element with higher reliability than the piezoelectric transformer element of the first embodiment can be realized. Since the thickness of the sintered external electrodes 4 and 5 are as very small, about several μm to 10 μm, the widthwise dimension (width) of the housing need not be designed to be large due to the external electrodes 4 and 5 in mounting the piezoelectric transformer element 16 on the housing.

Third Embodiment

In the second embodiment, the external electrodes 4 and 5 are formed on the side surfaces of the piezoelectric transformer element 16 in order to improve the reliability of electrical connection. In the third embodiment, two columnar interlevel connection conductors as described in "DESCRIPTION OF THE RELATED ART" section are formed inside the element as conductors corresponding to the external electrodes 4 and 5, thereby attaining electrical connection reliability equal to that of the piezoelectric transformer element 16 according to the second embodiment.

The outer shape of a piezoelectric transformer element 26 according to the third embodiment is the same as that of the piezoelectric transformer element 6 shown in FIGS. 1 and 2, and a description thereof will be omitted.

Figure 10:
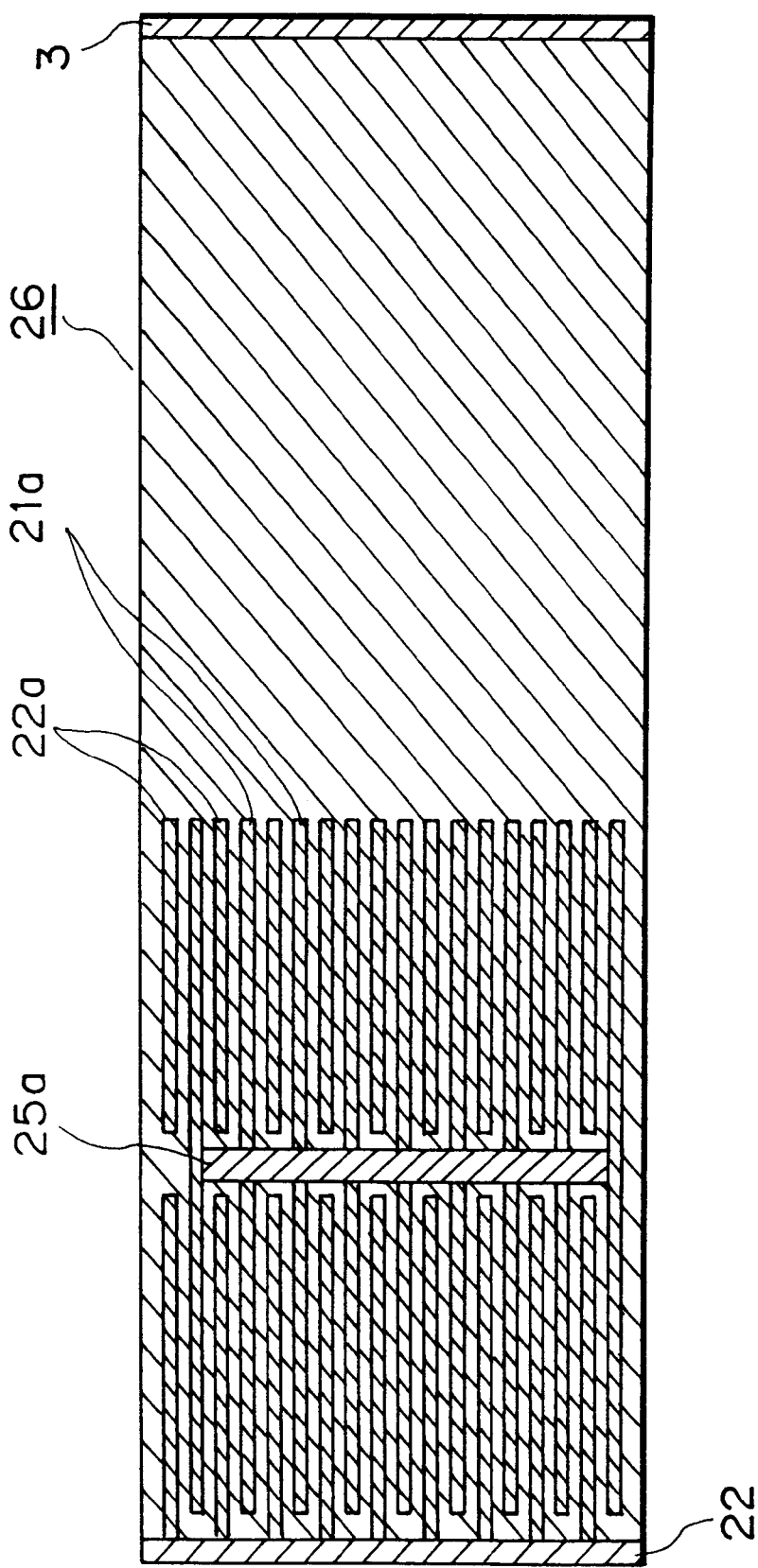
FIG. 10 is a sectional view of a piezoelectric transformer element according to the third embodiment of the present invention.

FIG. 10 is a sectional view of the piezoelectric transformer element according to the third embodiment of the present invention taken along the line I—I in FIG. 2. As shown in FIG. 10, pluralities of internal electrodes 21a and 22a are alternately stacked inside the input region of the piezoelectric transformer element 26 via thin-plate-like piezoelectric green sheets (corresponding to piezoelectric green sheets 8 before sintering) in the element. An interlevel connection conductor 25a is connected to a plurality of internal electrodes 21a, while an interlevel connection conductor 25b (not shown in a sectional view of FIG. 10 for illustrative convenience) is connected to a plurality of internal electrodes 22a. Further, similar to the first embodiment, the internal electrodes 21a and 22a have projections to be respectively connected to external electrodes 21 and 22 on the end face side of the piezoelectric transformer element 26 in the longitudinal direction.

The formation positions of the interlevel connection conductors 25a and 25b are not limited as far as they fall within the input region of the piezoelectric transformer element 26. In the third embodiment, the interlevel connection conductors 25a and 25b are formed at positions corresponding to vibration nodes so as not to interfere with vibration of the element.

Each internal electrode may be exposed on the side surface, not be included in the piezoelectric transformer element, of the piezoelectric transformer element.

Figure 12:
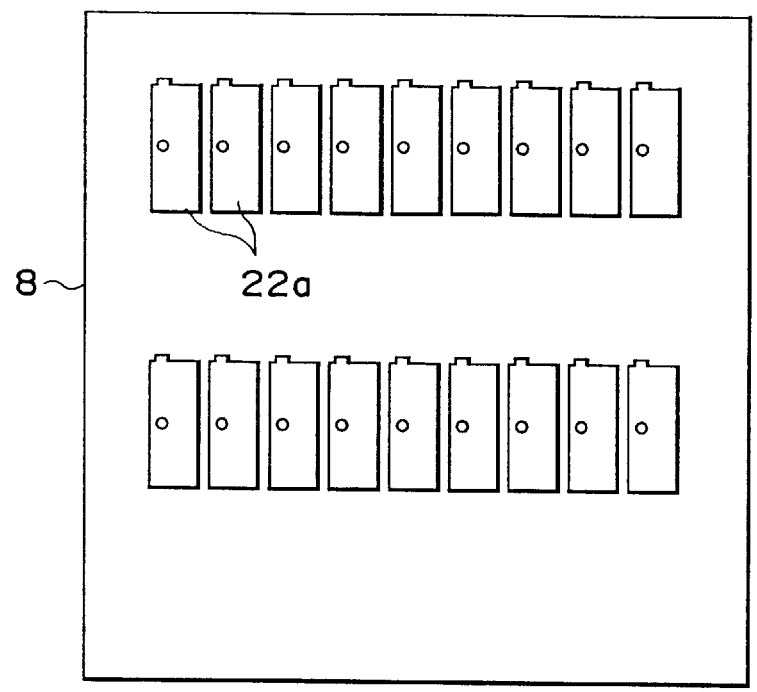
FIG. 12 is a plan view showing a plurality of internal electrodes formed on the piezoelectric green sheet according to the third embodiment of the present invention.
Figure 13:
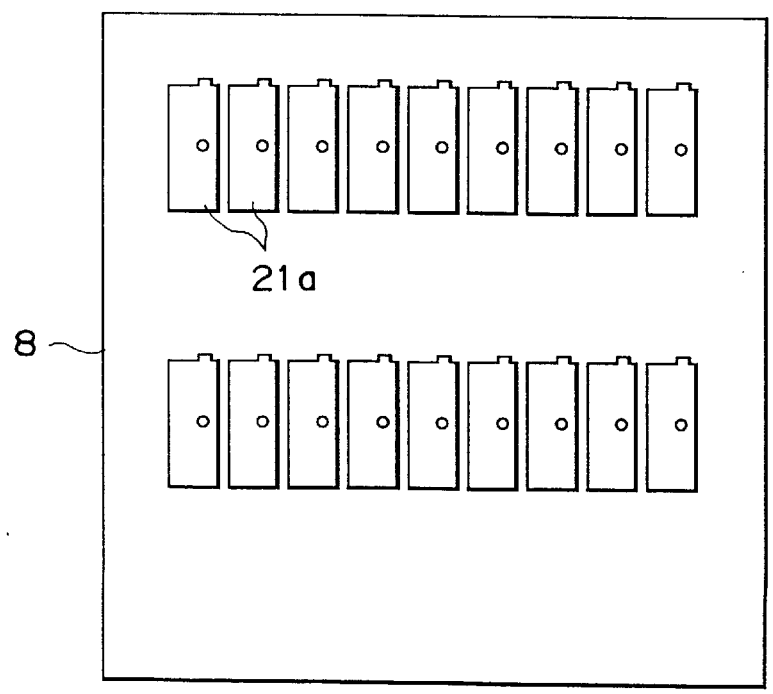
FIG. 13 is a plan view showing a plurality of internal electrodes formed on the piezoelectric green sheet according to the third embodiment of the present invention.

The manufacturing process of the piezoelectric transformer element 26 having this structure will be described with reference to FIGS. 11 to 13.

Figure 11:
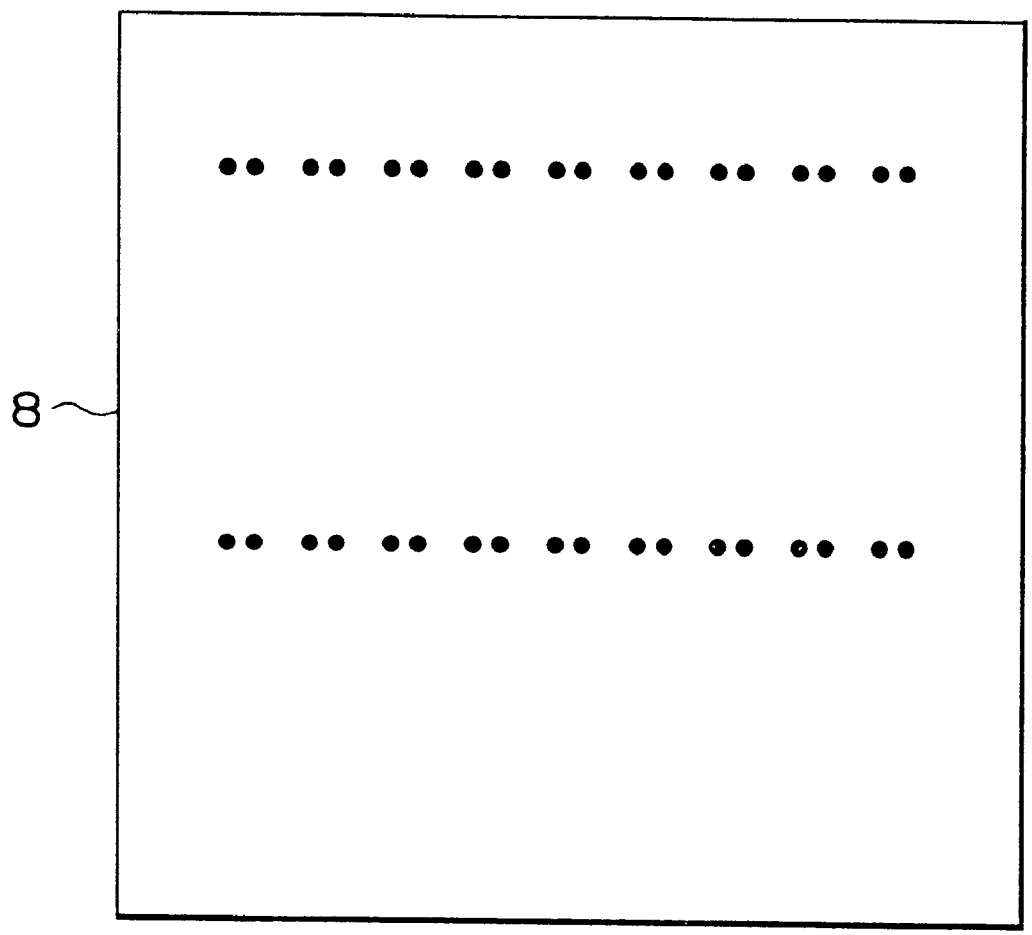
FIG. 11 is a plan view showing a piezoelectric green sheet having holes for an interlevel connection conductor according to the third embodiment of the present invention.

FIG. 11 is a plan view showing a piezoelectric green sheet having holes for the interlevel connection conductor according to the third embodiment of the present invention. FIGS. 12 and 13 are plan views showing a plurality of internal electrodes formed on the piezoelectric green sheet according to the third embodiment of the present invention. Such piezoelectric green sheets are alternately stacked and cut into a predetermined shape to form a piezoelectric transformer element 26 having no external electrodes 3, 21, and 22.

(1) By the same method as in the first embodiment, a piezoelectric green sheet 8 is manufactured and bonded to a frame. Holes for filling paste for forming the interlevel connection conductors 25a and 25b are formed to have a diameter of 0.12 mm upon sintering in two positions corresponding to the resonance nodes of the element after the piezoelectric green sheet 8 is cut into a plurality of piezoelectric transformer elements 26. FIG. 11 shows this state. Ag—Pd paste is filled in these holes by printing using metal masks.

(2) Ag—Pd paste for forming the internal electrodes 21a and 22a is printed using screen masks on the piezoelectric green sheet 8 in the state of FIG. 11. To alternately connect the internal electrodes 21a and 22a to the interlevel connection conductors 25a and 25b, two types of screen masks are used, an odd-numbered sheet (FIG. 13) and an even-numbered sheet (FIG. 12), upon stacking. Note that, similar to the first embodiment, each internal electrode is provided with a projection at a portion on the end face side of the piezoelectric transformer element 26 in the longitudinal direction after sintering.

(3) 10 piezoelectric green sheets 8 on which internal electrodes 21a are printed, and 10 piezoelectric green sheets 8 on which internal electrodes 22a are printed are alternately stacked, a piezoelectric green sheet on which no electrode is printed is put on the top, and all the sheets are thermally pressed at 100° C. and 30 MPa. The resultant structure is sintered using an alumina vessel in the air at 1,150° C. for 2hours. By stacking and calcining the 21 piezoelectric sheets, the element has a thickness of 2.2 mm upon calculation.

(4) After the sintering, the sintered structure is cut into a plurality of 32 mm×5 mm elements by a diamond cutter. 2-mm wide Ag paste for forming the external electrodes 21 and 22 is printed on the projections of the internal electrodes 21a and 22a exposed on the end face of the input region of each cut element. Ag paste for forming the external electrode 3 is printed on the end face of the output region of the element. The element printed with the Ag paste is loaded into a furnace at 700° C. to sinter the paste portion, thereby forming an external electrode 1, 2, and 3.

(5) The sintered element is dipped in insulating oil at 150° C. to polarize the input region at field strength of 3 kV/mm for 30 minutes. The external electrodes of the input region are short-circuited, and DC voltage of 1.5 kV/mm is applied between the short-circuited portion and the external electrode on the end face of the output region to perform polarization for 30 minutes, thereby obtaining a piezoelectric transformer element 26.

In the piezoelectric transformer element 26 described in the third embodiment, the internal electrode, the external electrode, and the interlevel connection conductor are connected. Accordingly, a piezoelectric transformer element 26 with high reliability can be realized, similar to the second embodiment.

Fourth Embodiment

The fourth embodiment concerns a housing method of mounting the piezoelectric transformer element according to the first to third embodiments on a housing. In the following description, a housing method of mounting the piezoelectric transformer element 6 described in the first embodiment on the housing will be exemplified.

Figure 14:
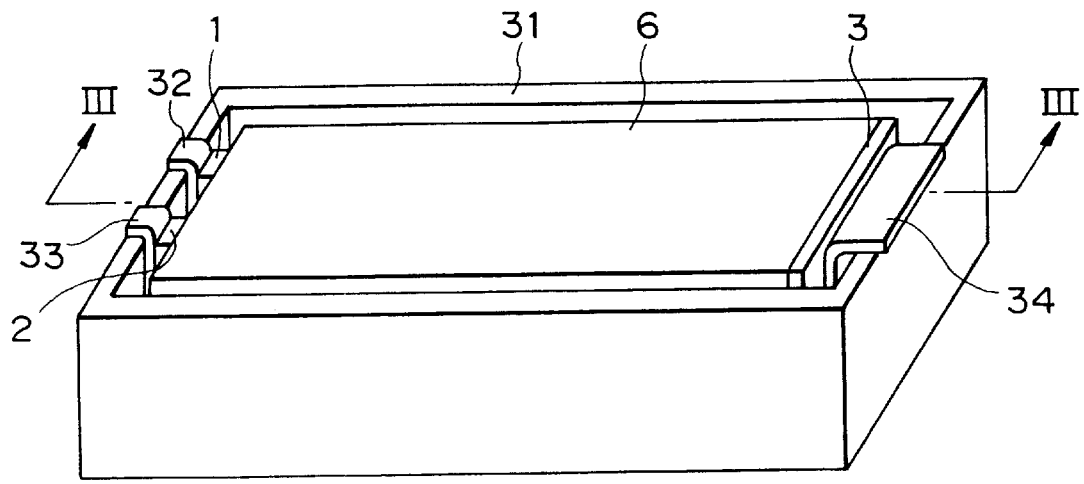
FIG. 14 is a perspective view showing a housing according to the fourth embodiment of the present invention on which a piezoelectric transformer element is mounted.
Figure 15:
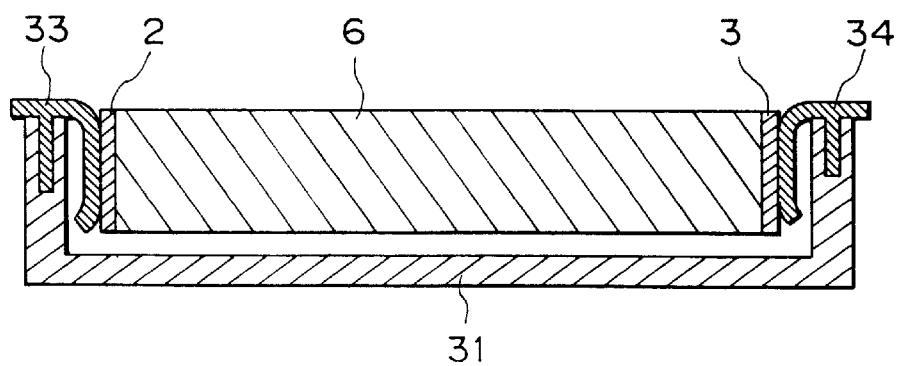
FIG. 15 is a sectional view taken along the line III—III in FIG. 14.

FIG. 14 is a perspective view showing a housing according to the fourth embodiment of the present invention on which a piezoelectric transformer element is mounted. FIG. 15 is a sectional view taken along the line III—III in FIG. 14. In FIG. 15, the internal structure of the piezoelectric transformer element 6 is not illustrated.

As shown in FIGS. 14 and 15, a housing 31 is formed from an insulating resin and has an internal dimension of L 32 mm×W 5.2 mm×D 2.4 mm (note that the length L is equal to the distance between a mount terminal 32 or 33 and a mount terminal 34). The mount terminals 32 and 33 for applying input voltage, and the mount terminal 34 for extracting output voltage are integrally formed on the two end faces of the housing 31.

According to the method of mounting the piezoelectric transformer element 6 on the housing 31 having this structure, the piezoelectric transformer element 6 is inserted in the housing to make external electrodes 1, 2, and 3 respectively abut against the mount terminals 32, 33, and 34. Each abutted portion is fixed with solder as a conductive connection material, or conductive adhesive. As a result, the piezoelectric transformer element 6 is fixed inside the housing 31, and the mount terminals are electrically connected.

When the piezoelectric transformer element 6 is driven in the λ mode, a resonance node comes to a position corresponding to ¼ the length of the element from the end portion of the element. When the piezoelectric transformer element 6 driven in the λ mode is resonating, the total length of the element is kept almost constant. Therefore, even if the two end faces of the piezoelectric transformer element 6 are fixed to the housing 31, the fixed state is not deteriorated by resonance.

In this manner, in the housing 31 of the fourth embodiment, the piezoelectric transformer element 6 is fixed at its end faces, and electrically connected to the mount terminals of the housing. Since the widthwise dimension (width) and height (depth) of the housing 31 can be satisfactorily set in consideration of only the width and height of the piezoelectric transformer element itself, the width and height of the housing can be reduced. Since no lead wire or the like is used, the manufacturing process can be simplified.

Fifth Embodiment

The fifth embodiment is directed to another housing method of fixing the piezoelectric transformer element at its two end faces in the longitudinal direction, which is employed in the fourth embodiment. In the following description, a method of mounting the piezoelectric transformer element 6 described in the first embodiment will be exemplified.

Figure 16:
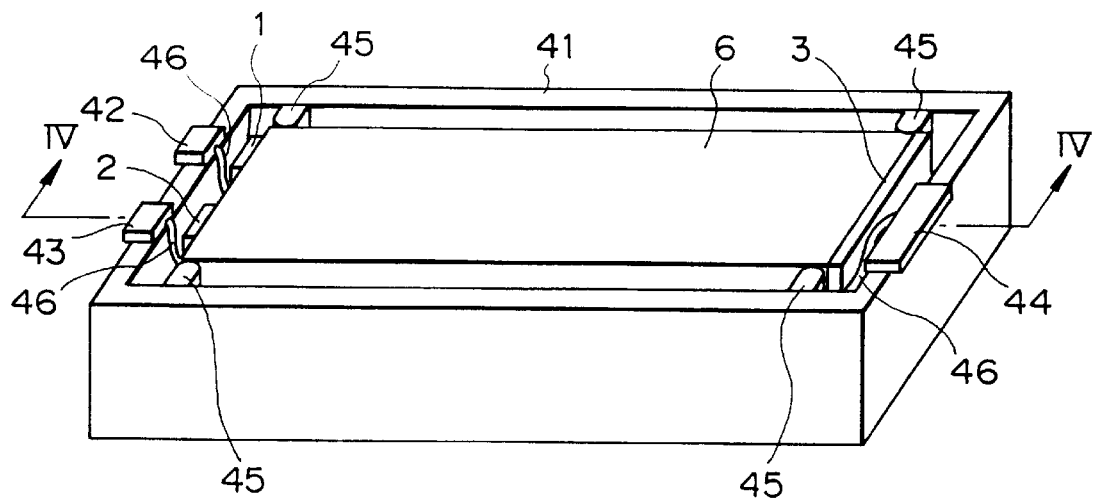
FIG. 16 is a perspective view showing a housing according to the fifth embodiment of the present invention on which a piezoelectric transformer element is mounted.
Figure 17:
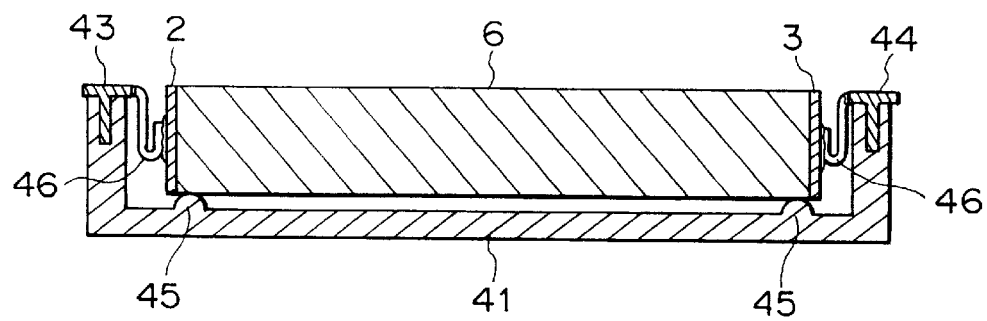
FIG. 17 is a sectional view taken along the line IV—IV in FIG. 16.

FIG. 16 is a perspective view showing a housing according to the fifth embodiment of the present invention on which a piezoelectric transformer element is mounted. FIG. 17 is a sectional view taken along the line IV—IV in FIG. 16. In FIG. 17, the internal structure of the piezoelectric transformer element 6 is not illustrated.

As shown in FIGS. 16 and 17, a housing 41 is formed from an insulating resin and has an internal dimension of L 32.6 mm×W 5.2 mm×D 2.4 mm. Projections 45 which fix the piezoelectric transformer element 6 inside the housing 41 and have a height of about 0.1 mm to 0.15 mm are formed at two positions 0.4 mm from end portions, i.e., positions near the two end faces of the piezoelectric transformer element 6 in the longitudinal direction. Epoxy-based adhesive is applied to the projections 45 to fix the piezoelectric transformer element 6 inside the housing 41.

Note that the projections 45 may be formed on only the internal bottom surface of the housing 41.

Mount terminals 42 and 43 for applying input voltage, and a mount terminal 44 for extracting output voltage are integrally formed on the two end faces of the housing 41. These mount terminals are formed from a metal member. In the fifth embodiment, external electrodes 1, 2, and 3 are electrically connected to the mount terminals 42, 43, and 44 by connecting lead wires 0.26 mm in diameter with solder or conductive adhesive.

Lead wires 46 are respectively connected to the external electrodes of the element prior to fixing of the piezoelectric transformer element 6 to the housing 41.

The projections 45 formed inside the housing 41 may have a continuous linear shape or may be discontinuous projections.

Figure 18:
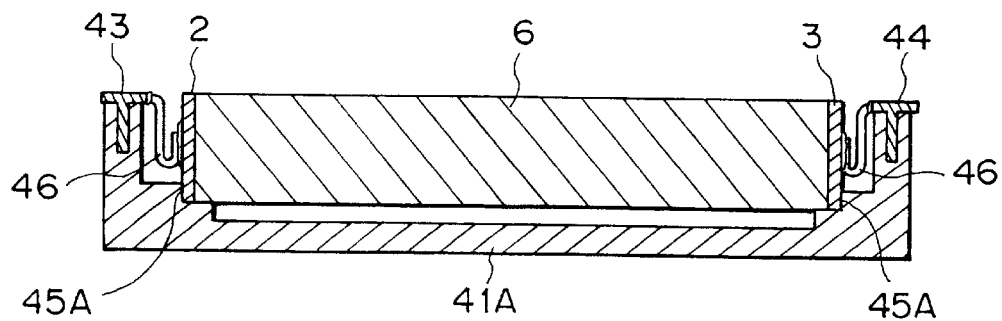
FIG. 18 is a sectional view showing the main part of a housing according to a modification of the fifth embodiment of the present invention on which a piezoelectric transformer element is mounted.
Figure 21:
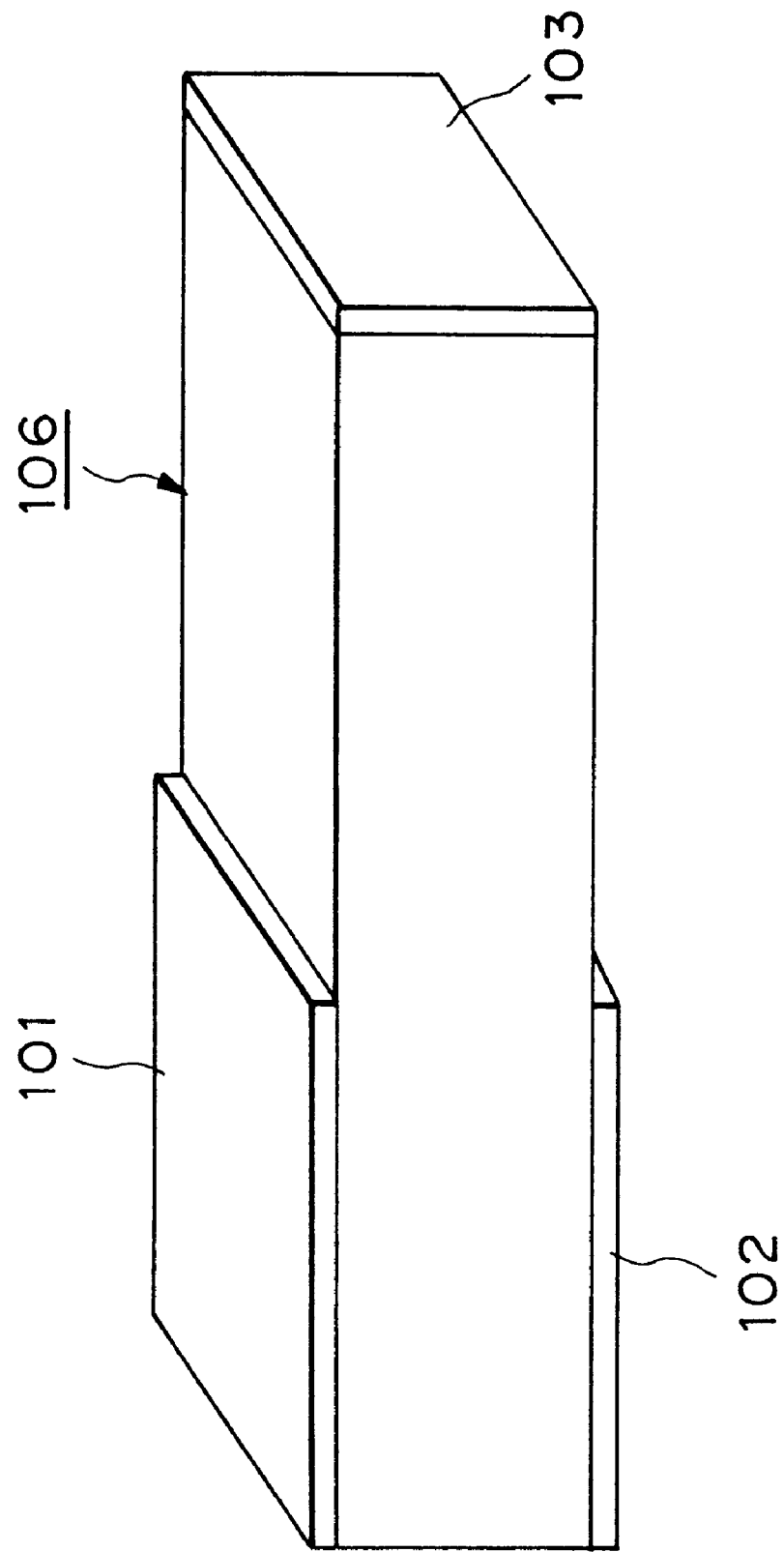
FIG. 21 is a perspective view showing a general Rosen piezoelectric transformer element.
Figure 22:
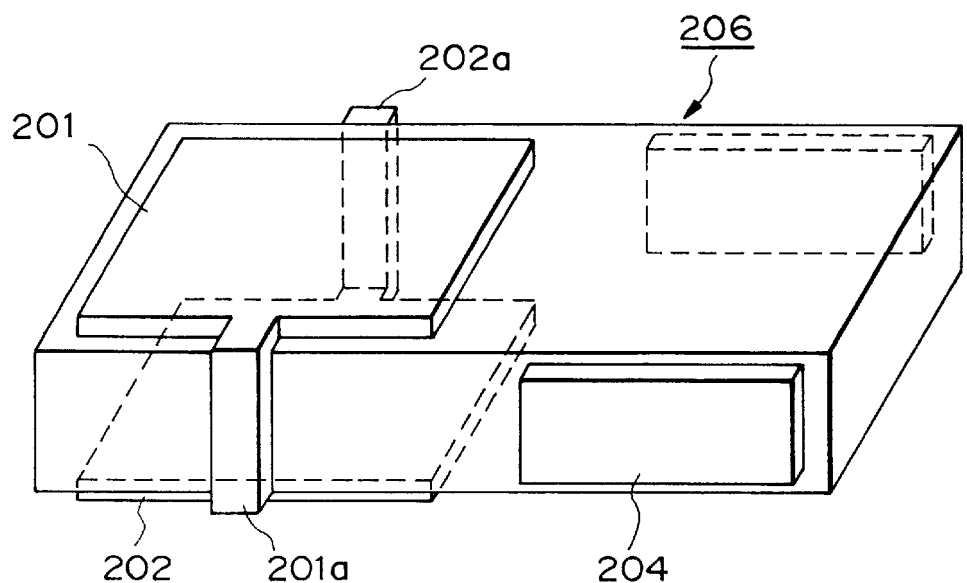
FIG. 22 is a perspective view showing a conventional piezoelectric transformer element.

The shape of the projection 45 is not limited to the one shown in FIGS. 16 and 17. For example, projections 45A of a housing 41A in a sectional view of FIG. 18 showing the main part may be formed near the two end faces of the piezoelectric transformer element 6 in the longitudinal direction so as to fix the element.

In the fifth embodiment, the mount terminals of the housing 41 or 41A are electrically connected to the external electrodes of the piezoelectric transformer element 6 on the end faces of the housing via the lead wires 46. This additionally requires the step of connecting the lead wires, but the piezoelectric transformer element 6 can be reliably supported inside the housing 41.

In the above-mentioned embodiments, since the external electrode for applying input voltage is formed on the end face of the element, no external electrodes are required on the upper and lower surfaces of the input region of the element. However, in the polarization step, external electrodes may be formed on the upper and lower surfaces of the element, if necessary.

The dimensions of the piezoelectric transformer element, the electrode, and the like in the respective embodiments are merely examples, and their dimensions are not limited to the above values.

[Discussion about Method of Fixing Piezoelectric Transformer Element at Two End Faces]

The housing method described in the fourth and fifth embodiments, i.e., the method of fixing the piezoelectric transformer element at its two end faces will be discussed.

Figure 23:
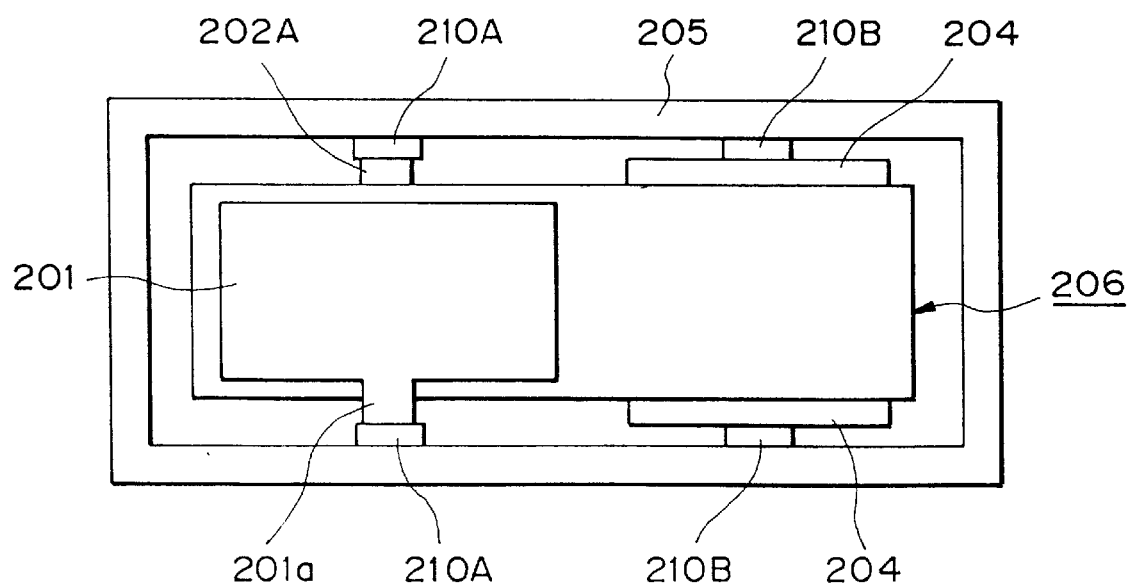
FIG. 23 is a top view showing the state wherein the piezoelectric transformer element in FIG. 22 is mounted on a housing.
Figure 24:
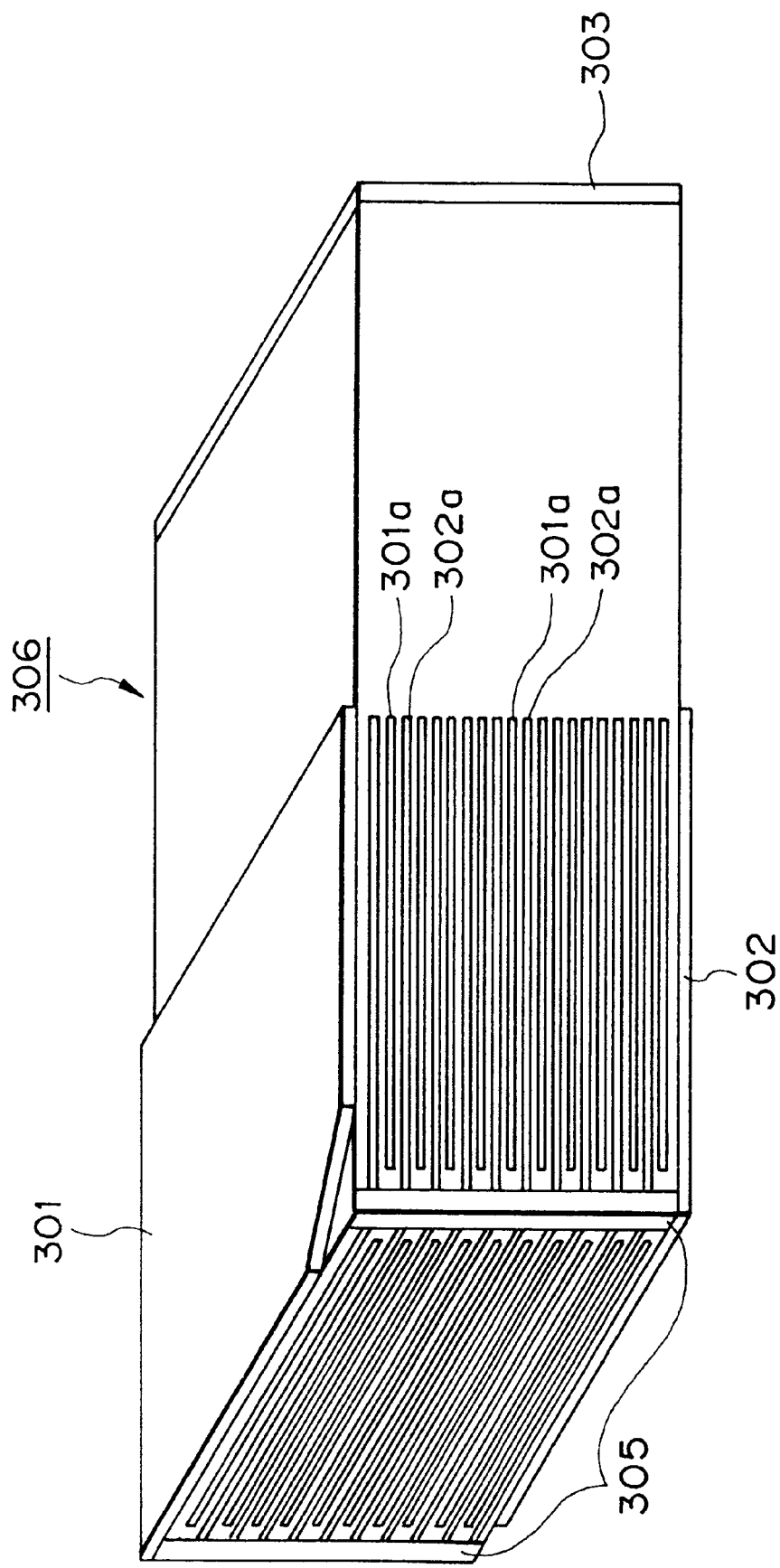
FIG. 24 is a perspective view showing another conventional piezoelectric transformer element.

As a conventional method of housing the piezoelectric transformer element in the housing, the piezoelectric transformer element is generally supported at the positions of nodes (to be referred to as node positions hereinafter) of the element upon resonance, like the conventional piezoelectric transformer element 206 and housing 205 in FIG. 23. This method is based on common knowledge about vibration according to which a medium (in this case, the material of each component constituting the piezoelectric transformer element) generates so-called longitudinal waves (compression waves), and when the longitudinal waves are stationary waves, the medium has no displacement at the nodes of the stationary waves, and the positional interval between nodes is kept at a predetermined value. Accordingly, in the conventional piezoelectric transformer element housing method (fixing method), the optimal fixing positions of the element are at two node positions corresponding to L/2 from the two end faces of the element in the $\lambda$ mode, i.e., the driving mode where one wavelength ($\lambda$) of voltage for driving the piezoelectric transformer element is equal to the length 2L of the element in the longitudinal direction. To prevent attenuation of resonance, the element must be supported (fixed) without any deviation from these node positions. In other words, in the $\lambda$ mode, the two end faces of the piezoelectric transformer element in the longitudinal direction serve as resonance loops, and the element has maximum displacement at these loops. For this reason, the technical principle of the present invention in which the element is supported at the resonance loop positions, i.e., the two end faces of the element is not adopted.

However, in extensive studies on piezoelectric transformer elements, and driving circuits and housings for the elements, the present applicant has supported a piezoelectric transformer element at its two end faces in the longitudinal direction and resonated the supported piezoelectric transformer element in the $\lambda$ mode. As a result, almost the same boosting efficiency as the boosting efficiency in the conventional method of supporting the piezoelectric transformer element at node positions could be obtained.

FIGS. 19 and 20 are tables showing the comparison results between the piezoelectric transformer element supporting method according to the fourth and fifth embodiments, and the conventional method of supporting the piezoelectric transformer element at nodes. FIGS. 19 and 20 respectively show the measurement results when the piezoelectric transformer element is driven in the $\lambda$ mode and the $\lambda/2$ mode.

In measurement, the piezoelectric transformer element in FIGS. 1 to 3 described in the first embodiment was supported by the method according to the fourth and fifth embodiments. As for the conventional supporting method, the piezoelectric transformer element in FIGS. 1 to 3 described in the first embodiment was supported at nodes and externally driven via lead wires. In either case, measurement conditions in driving the piezoelectric transformer element were a load of 50 k$\Omega$ and an output of 4 W.

As shown in FIGS. 19 and 20, the boosting ratio and efficiency (%) in the supporting method according to the fourth and fifth embodiments are slightly lower than those in the conventional supporting method, but the difference between them is negligible in practical use. This phenomenon does not agree with results expected by the conventional principle.

An examination of the phenomenon will be given below. As excellent boosting characteristics (resonance characteristics) can be obtained even if the piezoelectric transformer element is supported at its two end faces in the longitudinal direction, the total length of the piezoelectric transformer element is assumed to be nearly constant upon resonance. More specifically, the present applicant found that the total length of the element was maintained the same when the piezoelectric transformer element resonated upon driving. This means that fixing the piezoelectric transformer element inside the housing at or near the two end faces of the element in the longitudinal direction does not lead to attenuation of resonance which decreases the boosting efficiency of the element, and to deterioration of the fixed state of the element inside the housing. In the fourth and fifth embodiments, therefore, the piezoelectric transformer element 6 described in the first embodiment is fixed to the housing 31, 41, or 41A at the two end faces of the element in the longitudinal direction.

The present applicant studied relevant literature in order to elucidate the phenomenon, and found that the displacement of the piezoelectric transformer element upon resonance is given by equation 1 below. According to equation (17) in Sekiji Yamagata, "Vibrating Modes, Surface Electric Charge and Potential Distributions of Ceramic Transformer", Electronic Ceramics, Summer 1976, pp. 44–50, displacement ξ(x) is given by $$\xi(X) = A \cos(m\pi/2L) x e^{j(m x v/2L) t + \epsilon} \quad \text{[Equation 1]}$$

where ξ(x):

displacement amount [mm] of medium of position x at time t

A: predetermined coefficient m: vibration mode (m=2 in λ mode)

2L: length [mm] of piezoelectric transformer element in longitudinal direction x: distance [mm] from one end portion of element to arbitrary point e: base of natural logarithm j: square root of −1

V: velocity of sound [mm/sec] within element t: arbitrary time [sec]

ε: dielectric constant [F/mm]

The total length of the piezoelectric transformer element in the longitudinal direction upon driving in the λ mode (m=2) is obtained by integrating equation 1 for x=0 to 2L. The result is always a predetermined value regardless of the time t. That is, the integration result indicates that the distance between the two end faces of the piezoelectric transformer element does not change even upon driving the element in the λ mode, and explains the phenomenon experimentally found by the present applicant.

At node positions which appear in the input and output regions of the piezoelectric transformer element upon resonance in the λ mode, the medium at these positions probably vibrates in the longitudinal direction of the element with reference to positions in a still state. More specifically, presumably the node positions repeat relative movement with reference to the end faces of the input and output regions. This can be explained by considering the experimental phenomenon and calculation results supporting that the length of the piezoelectric transformer element does not change upon resonance in the λ mode, and a known phenomenon that the input and output regions of the element repeatedly expand and contract in opposite directions upon resonance.

When, therefore, the piezoelectric transformer element is fixed at or near its two end faces in the longitudinal direction, the element should not be fixed by a projection, adhesive, or the like at positions except for the two end faces or their vicinities.

As described above, when the piezoelectric transformer element is used to resonate in the λ mode, it can be supported at only its two end faces in the longitudinal direction, and the housing can employ various shapes. At the same time, the height and width required to mount the element can be reduced.

When equation 1 above was applied to driving modes of, e.g., the λ/2 mode (m=1) and the 3λ/2 mode (m=3), the length of the piezoelectric transformer element changed when resonating in these driving modes. Even in this case, however, deterioration of resonance characteristics caused by supporting the element at its end was very slight and did not pose any serious problem in practical use from a comparison between the experimental results in the case in which the element is supported at resonance nodes and the case in which the element is supported at its ends. On the contrary, these modes yield substantially the same industrial advantages as the λ mode in terms of variations in piezoelectric transformer element fixing and housing methods.

As has been described above, according to the above embodiments, a piezoelectric transformer element whose height and width necessary for mounting can be decreased, and a method of housing the same can be provided.

As many apparently widely different embodiments of the present invention can be made without departing from the spirit and scope thereof, it is to be understood that the invention is not limited to the specific embodiments thereof except as defined in the appended claims.

What is claimed is:

1. A piezoelectric transformer element with a multi layer structure having an input region which is polarized in a direction of thickness and has input electrodes, and an output region which is polarized in a longitudinal direction and has an output electrode, comprising:

a plurality of internal electrodes as the input electrode which are formed between a plurality of piezoelectric layers;

first and second external electrodes formed on an end face of said piezoelectric transformer element in the longitudinal direction on the input region side; and an external electrode formed on an end face of said piezoelectric transformer element in the longitudinal direction on the output region side, wherein said plurality of internal electrodes are alternately connected to said first and second external electrodes every other layer, and said first and second external electrodes are electrodes for applying input voltage, said element further comprises third and fourth external electrodes formed on side surfaces parallel to the longitudinal direction of said piezoelectric transformer element on the input region side, and said plurality of internal electrodes are also alternately connected to said third and fourth external electrodes every other layer.

2. The element according to claim 1, characterized in that said third and fourth external electrodes are formed at positions corresponding to vibration nodes of said piezoelectric transformer element.

3. A method of mounting a piezoelectric transformer element on a housing, comprising the steps of:

forming a piezoelectric transformer element with a multi layer structure having an input region which is polarized in a direction of thickness and has input electrodes, and an output region which is polarized in a longitudinal direction and has an output electrode, in which the element comprises:

a plurality of internal electrodes as the input electrode which are formed between a plurality of piezoelectric layers, first and second external electrodes formed on an end face of said piezoelectric transformer element in the longitudinal direction on the input region side; and an external electrode formed on an end face of said piezoelectric transformer element in the longitudinal direction on the output region side, wherein said plurality of internal electrodes are alternately connected to said first and second external electrodes every other layer, and said external electrodes are electrodes for applying input voltage, said element further comprises third and fourth external electrodes formed on side surfaces parallel to the longitudinal direction of said piezoelectric transformer element on the input region side, and said plurality of internal electrodes are also alternately connected to said third and fourth external electrodes every other layer;

forming a plurality of mount terminals (32, 33, 34) on two end faces of said housing in a longitudinal direction;

inserting said piezoelectric transformer element in said housing to make said plurality of mount terminals abut against said first and second external electrodes and said output electrode; and fixing the abutted portions by a conductive connection material.

4. A method of mounting a piezoelectric transformer element on a housing, comprising the steps of:

forming a piezoelectric transformer element with a multi layer structure having an input region which is polarized in a direction of thickness and has input electrodes, and an output region which is polarized in a longitudinal direction and has an output electrode, in which the element comprises:

a plurality of internal electrodes as the input electrode which are formed between a plurality of piezoelectric layers;

first and second external electrodes formed on an end face of said piezoelectric transformer element in the longitudinal direction on the input region side; and an external electrode formed on an end face of said piezoelectric transformer element in the longitudinal direction on the output region side, wherein said plurality of internal electrodes are alternately connected to said first and second external electrodes every other layer, and said external electrodes are electrodes for applying input voltage, said element further comprises third and fourth external electrodes formed on side surfaces parallel to the longitudinal direction of said piezoelectric transformer element on the input region side, and said plurality of internal electrodes are also alternately connected to said third and fourth external electrodes every other layer, forming projections near positions inside said housing where two end faces of said element in a longitudinal direction are located after said piezoelectric transformer element is housed, and supporting said piezoelectric transformer element by said projections;

connecting, via lead wires, said first and second external electrodes to a plurality of mount terminals formed on an end face of said housing in the longitudinal direction; and connecting, via a lead wire, said output electrode to a mount terminal formed on the other end face of said housing in the longitudinal direction.

* * * * *